United States Patent
Watanabe et al.

(10) Patent No.: US 7,932,729 B2
(45) Date of Patent: Apr. 26, 2011

(54) TEST APPARATUS AND TEST METHOD

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/570,400

(22) Filed: Sep. 30, 2009

(65) Prior Publication Data

US 2010/0090709 A1 Apr. 15, 2010

Related U.S. Application Data

(63) Continuation of application No. PCT/JP2008/057710, filed on Apr. 21, 2008.

(30) Foreign Application Priority Data

Apr. 24, 2007 (JP) ................................. 2007-114637

(51) Int. Cl.
    *G01R 31/08* (2006.01)
(52) U.S. Cl. ........ 324/527; 375/226; 375/291; 375/371; 714/709; 714/715
(58) Field of Classification Search .................. 324/527, 324/537; 375/226
    See application file for complete search history.

(56) References Cited

U.S. PATENT DOCUMENTS

| 7,756,197 | B1 * | 7/2010 | Ferguson et al. | 375/224 |
|---|---|---|---|---|
| 2003/0041294 | A1 * | 2/2003 | Moll et al. | 714/709 |
| 2004/0143406 | A1 * | 7/2004 | Nishikobara et al. | 702/69 |
| 2004/0223559 | A1 * | 11/2004 | Hill | 375/306 |
| 2004/0251914 | A1 * | 12/2004 | Doi et al. | 324/537 |
| 2005/0116759 | A1 * | 6/2005 | Jenkins et al. | 327/291 |
| 2005/0271131 | A1 * | 12/2005 | Hafed et al. | 375/224 |
| 2006/0041797 | A1 * | 2/2006 | Miyaji | 714/700 |
| 2006/0056561 | A1 * | 3/2006 | Zhang | 375/376 |
| 2006/0184332 | A1 * | 8/2006 | Ishida et al. | 702/69 |
| 2007/0098128 | A1 * | 5/2007 | Ishida et al. | 375/376 |

FOREIGN PATENT DOCUMENTS

| JP | 5-60808 A | 3/1993 |
|---|---|---|
| JP | 6-265597 A | 9/1994 |
| JP | 11-38087 A | 2/1999 |
| JP | 2000-221254 A | 8/2000 |
| JP | 2005-91108 A | 4/2005 |
| JP | 2006-293756 A | 10/2006 |

OTHER PUBLICATIONS

International Search Report (ISR) for PCT/JP2008/057710.
Written Option (PCT/ISA/237) of PCT/JP2008/057710.

* cited by examiner

*Primary Examiner* — Timothy J Dole
*Assistant Examiner* — Benjamin M Baldridge
(74) *Attorney, Agent, or Firm* — Chen Yoshimura LLP

(57) ABSTRACT

Provided is a test apparatus that tests a device under test, comprising a pattern generating section that generates a test pattern determined according to a test signal to be supplied to the device under test; a timing signal generating section that generates a timing signal indicating a timing for supplying the test signal to the device under test; a digital filter that filters the test pattern to output a jitter control signal representing jitter corresponding to the test pattern; a jitter injecting section that injects the timing signal with jitter by delaying the timing signal according to the jitter control signal; and a waveform shaping section that generates the test signal formed according to the test pattern, with the timing signal into which the jitter is injected as a reference.

7 Claims, 10 Drawing Sheets

TEST APPARATUS AND TEST METHOD

CROSS REFERENCE TO RELATED APPLICATION

This is a continuation application of PCT/JP2008/057710 filed on Apr. 21, 2008 which claims priority from a Japanese Patent Application NO. 2007-114637 filed in JP on Apr. 24, 2007, the contents of which are incorporated herein by reference.

BACKGROUND

1. Technical Field

The present invention relates to a test apparatus and a test method. In particular, the present invention relates to a test apparatus and a test method for testing a device under test by supplying the device under test with a test signal into which jitter is injected.

2. Related Art

A test apparatus that tests performance relating to jitter of a device under test is known, as in, for example, Japanese Patent Application Publication No. 2005-91108. This test apparatus is provided with a jitter injecting section that injects jitter into a test signal supplied to a device under test, and a jitter injection control section that generates a digital control signal representing the jitter to be injected by the jitter injecting section.

The jitter injecting section includes a variable delay section that delays the test signal according to the digital control signal. The jitter injection control section includes a sine wave generator that generates sinusoidal data and a random data generator that generates random data. The jitter injection control section outputs a digital control signal representing sinusoidal jitter and a digital control signal representing random jitter, based on the data output from the sine wave generator and the random data generator. In this way, the test apparatus can test jitter performance of the device under test by supplying the device under test with a test signal into which random jitter and sinusoidal jitter are injected.

Known types of jitter that are added to a signal transmitted between devices include jitter caused by transmission line loss, jitter caused by inter-symbol interference, and the like. The test apparatus can desirably test the jitter performance of the device under test by supplying the device under test with a test signal into which is injected jitter caused by transmission line loss or the like. The amount of jitter caused by transmission line loss or the like, however, differs according to the waveform of the signal transmitted between the devices.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a pattern generating section that generates a test pattern determined according to a test signal to be supplied to the device under test; a timing signal generating section that generates a timing signal indicating a timing for supplying the test signal to the device under test; a digital filter that filters the test pattern to output a jitter control signal representing jitter corresponding to the test pattern; a jitter injecting section that injects the timing signal with jitter by delaying the timing signal according to the jitter control signal; and a waveform shaping section that generates the test signal formed according to the test pattern, with the timing signal into which the jitter is injected as a reference.

According to a second aspect related to the innovations herein, one exemplary test apparatus may include a test apparatus that tests a device under test, comprising a signal output section that outputs a test signal to the device under test; a signal input section that receives an output signal from the device under test output in response to the test signal; a pattern generating section that generates an expected value pattern determined according to the output signal to be output from the device under test; a timing signal generating section that generates a strobe signal indicating a timing for comparing the expected value pattern and the output signal; a digital filter that filters the expected value pattern to output a jitter control signal representing jitter corresponding to the expected value pattern; a jitter injecting section that injects the strobe signal with jitter by delaying the strobe signal according to the jitter control signal; and a comparing section that compares the output signal to the expected value pattern at a timing of the strobe signal into which the jitter is injected.

According to a third aspect related to the innovations herein, one exemplary test method may include a method for testing a device under test, comprising generating a test pattern determined according to a test signal to be supplied to the device under test; generating a timing signal indicating a timing for supplying the test signal to the device under test; filtering the test pattern to output a jitter control signal representing jitter corresponding to the test pattern; injecting the timing signal with jitter by delaying the timing signal according to the jitter control signal; and generating the test signal formed according to the test pattern, with the timing signal into which the jitter is injected as a reference.

According to a fourth aspect related to the innovations herein, one exemplary test method may include a method for testing a device under test, comprising outputting a test signal to the device under test; receiving an output signal from the device under test output in response to the test signal; generating an expected value pattern determined according to the output signal to be output from the device under test; generating a strobe signal indicating a timing for comparing the expected value pattern and the output signal; filtering the expected value pattern to output a jitter control signal representing jitter corresponding to the expected value pattern; injecting the strobe signal with jitter by delaying the strobe signal according to the jitter control signal; and comparing the output signal to the expected value pattern at a timing of the strobe signal into which the jitter is injected.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
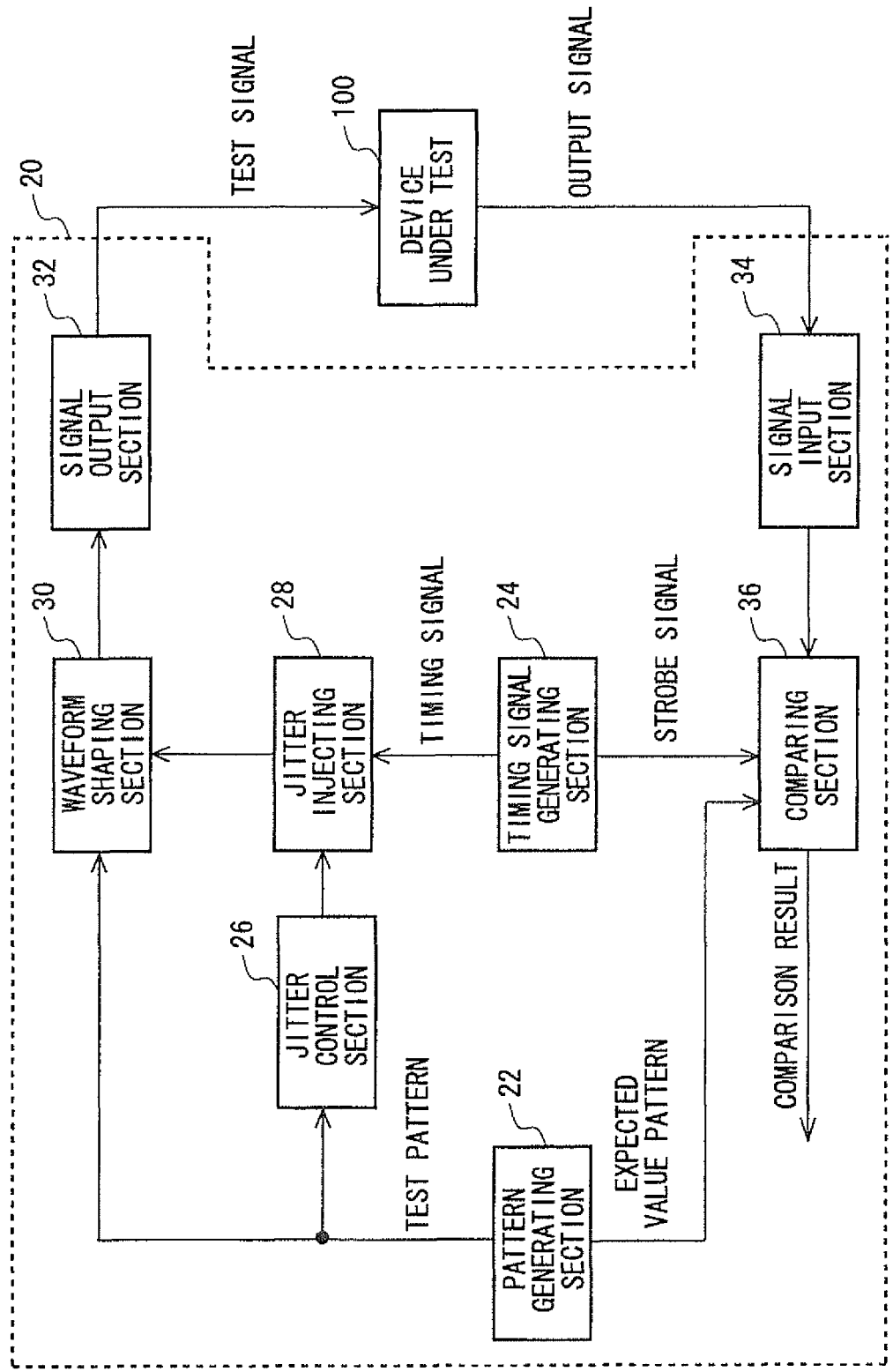
FIG. 1 shows a configuration of a test apparatus 20 according to an embodiment of the present invention, along with a device under test 100.

FIG. 1 shows a configuration of a test apparatus 20 according to an embodiment of the present invention, along with a device under test 100. The test apparatus 20 tests the device under test 100 by outputting a test signal into which jitter is injected to the device under test 100 and making a comparison between an output signal from the device under test 100 output in response to the test signal and an expected value. The test apparatus 20 is provided with a pattern generating section 22, a timing signal generating section 24, a jitter control section 26, a jitter injecting section 28, a waveform shaping section 30, a signal output section 32, a signal input section 34, and a comparing section 36.

The pattern generating section 22 generates a test pattern that determines the test signal to be supplied to the device under test 100. For example, the pattern generating section 22 may generate a test pattern that determines the waveform of the test signal to be supplied to the device under test 100. More specifically, the pattern generating section 22 may generate, for each prescribed test period, a test pattern that designates a delay amount from a reference timing of a rising edge in the test signal and a delay amount from a reference timing of a falling edge in the test signal. In addition, the pattern generating section 22 generates an expected value pattern according to the output signal that should be output from the device under test 100 in response to the test signal. For example, the pattern generating section 22 may generate an expected value pattern according to logic values of the output signal that should be output from the device under test 100.

The timing signal generating section 24 generates a timing signal indicating a timing at which the device under test 100 is supplied with the test signal. For example, the timing signal generating section 24 may generate a timing signal indicating a reference timing in the test period. In addition, the timing signal generating section 24 generates a strobe signal indicating a timing at which the expected value pattern and the output signal are compared to each other.

The jitter control section 26 outputs a jitter control signal that represents the jitter to be injected into the test signal. For example, the jitter control section 26 may output, as the jitter control signal, a digital value representing the amount of jitter to be injected into the test signal. The jitter injecting section 28 injects jitter into the timing signal by delaying the timing signal according to the jitter control signal. For example, for each test period, the jitter injecting section 28 may delay the timing signal generated by the timing signal generating section 24 by an amount indicated by the jitter control signal. The jitter injecting section 28 then supplies the timing signal into which the jitter is injected to the waveform shaping section 30.

The waveform shaping section 30 generates a test signal shaped according to the test pattern, with the timing signal into which jitter is injected serving as a reference. In other words, the waveform shaping section 30 generates the test signal with a waveform determined according to the test pattern, with the timing signal into which jitter is injected serving as a reference. For example, the waveform shaping section 30 may generate the test signal to rise at a timing of a timing signal that is obtained by delaying the timing signal into which jitter is injected by the delay amount of the rising edge designated by the test pattern. Furthermore, the waveform shaping section 30 may generate the test signal to fall at a timing of a timing signal that is obtained by delaying the timing signal into which jitter is injected by the delay amount of the falling edge designated by the test pattern.

The signal output section 32 outputs the test signal generated by the waveform shaping section 30 to the device under test 100. The signal input section 34 receives the output signal output by the device under test 100 in response to the test signal.

The comparing section 36 compares the output signal received from the signal input section 34 and the expected value pattern generated by the pattern generating section 22, at a timing of the strobe signal generated by the timing signal generating section 24. For example, the comparing section 36 may compare the logic value of the output signal and the logic value determined by the expected value pattern, at the timing of the strobe signal. The comparing section 36 outputs the comparison result between the output signal and the expected value pattern.

Figure 2:
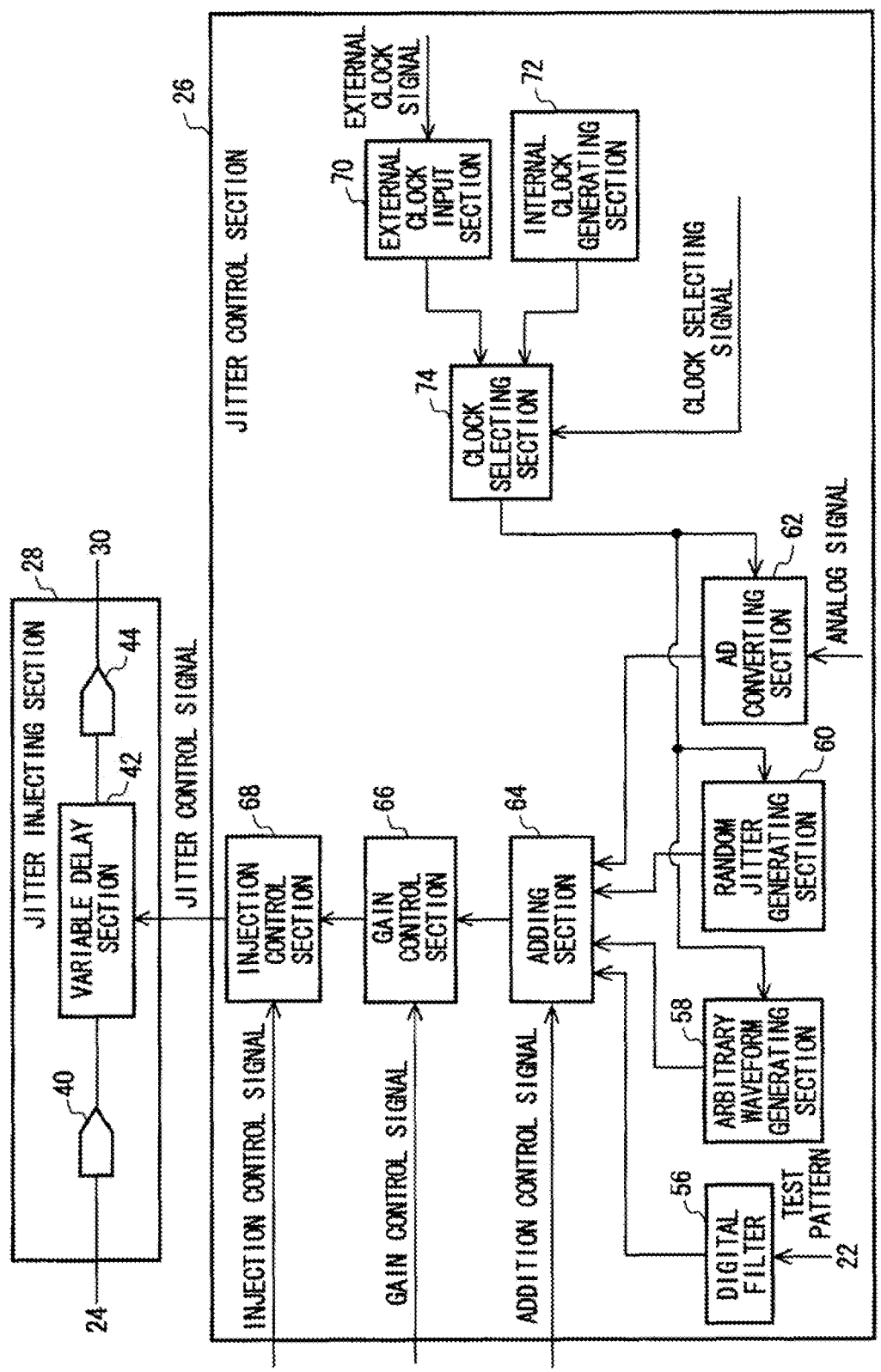
FIG. 2 shows configurations of the jitter control section 26 and the jitter injecting section 28 according to the present embodiment.

FIG. 2 shows configurations of the jitter control section 26 and the jitter injecting section 28 according to the present embodiment. The jitter injecting section 28 includes a signal input section 40, a variable delay section 42, and a signal output section 44.

The signal input section 40 receives the timing signal generated by the timing signal generating section 24, and supplies the variable delay section 42 with the received timing signal. The variable delay section 42 delays the timing signal received by the variable delay section 42 by a delay amount corresponding to the jitter amount designated by the jitter control signal supplied from the jitter control section 26. By using the variable delay section 42 in this way, the timing signal can be injected with the jitter amount designated by the jitter control signal. The signal output section 44 supplies the waveform shaping section 30 with the timing signal into which the variable delay section 42 injected the jitter.

The jitter control section 26 includes a digital filter 56, an arbitrary waveform generating section 58, a random jitter generating section 60, an AD converter 62, an adding section 64, a gain control section 66, an injection control section 68, an external clock input section 70, an internal clock generating section 72, and a clock selecting section 74. The digital filter 56 filters the test pattern generated by the pattern generating section 22 to generate a pattern-dependent jitter signal representing the jitter corresponding to the test pattern. More specifically, the digital filter 56 generates the pattern-dependent jitter signal representing the jitter that depends on the waveform of the test signal, by filtering the test pattern.

The arbitrary waveform generating section 58 generates an arbitrary waveform jitter signal representing the jitter of an arbitrary waveform. For example, the arbitrary waveform generating section 58 may output an arbitrary waveform jitter signal representing sinusoidal jitter. The random jitter generating section 60 generates a random jitter signal representing random jitter. The AD converter 62 samples an analog signal generated by an external analog signal source and outputs an analog jitter signal representing the jitter corresponding to the sampled analog signal.

The adding section 64 outputs, as the jitter control signal, the pattern-dependent jitter signal output from the digital filter 56. In this way, the adding section 64 can output a jitter control signal that represents the jitter corresponding to the test pattern.

Furthermore, the adding section 64 may select at least one of the arbitrary waveform jitter signal, the random jitter signal, and the analog jitter signal according to an addition control signal that designates the type of jitter to be injected to the test signal. The adding section 64 may then output a jitter control signal obtained by adding the selected jitter signal to the pattern-dependent jitter signal. In other words, the adding section 64 may add (i) a jitter signal representing a type of jitter uncorrelated to the test pattern to (ii) the jitter control signal representing the jitter correlated to the test pattern. The adding section 64 may receive the addition control signal from a controller or the like of the test apparatus 20 and the pattern generating section 22.

The adding section 64 may output, as the jitter control signal, one of the arbitrary waveform jitter signal, the random jitter signal, and the analog jitter signal, for example. Instead, the adding section 64 may output, as the jitter control signal, a signal obtained by adding together any two or more of the arbitrary waveform jitter signal, the random jitter signal, and the analog jitter signal, for example.

The gain control section 66 attenuates or amplifies the jitter control signal output from the adding section 64, according to a gain control signal that determines the gain of the jitter to be injected into the test signal. For example, when the jitter control signal is expressed as a binary code, the gain control section 66 may attenuate or amplify the jitter control signal by performing a shift computation. The gain control section 66 may receive the gain control signal from a controller or the like of the test apparatus 20 and the pattern generating section 22.

The injection control section 68 receives an injection control signal that designates whether jitter is injected to the timing signal, and, if this signal designates that jitter is not to be injected, sets the jitter control signal to a value that results in jitter not being injected. In other words, when the injection control signal designates that jitter is not to be injected, the injection control section 68 sets the jitter control signal to a value that causes the variable delay section 42 to not delay the timing signal. By using the injection control section 68 in this way, the test apparatus 20 can control whether jitter is injected to the test signal in real time. The injection control section 68 may receive the injection control signal from a controller or the like of the test apparatus 20 and the pattern generating section 22.

The external clock input section 70 receives an external clock signal synchronized with the timing signal received by the jitter injecting section 28, i.e. the external clock signal is synchronized with the system clock of the test apparatus 20. The external clock input section 70 supplies the received external clock signal to the clock selecting section 74.

The internal clock generating section 72 generates an internal clock signal that is not synchronized with the timing signal received by the jitter injecting section 28, i.e. the internal clock signal is not synchronized with the system clock of the test apparatus 20. The internal clock generating section 72 may be a liquid crystal oscillator or the like. The internal clock generating section 72 supplies the generated internal clock signal to the clock selecting section 74.

The clock selecting section 74 receives a clock selection signal that designates either the external clock signal or the internal clock signal. The clock selecting section 74 outputs either the external clock signal or the internal clock signal as the clock signal, according to the clock selection signal. The clock selecting section 74 may receive the clock selection signal from a controller or the like of the test apparatus 20 and the pattern generating section 22.

The clock selecting section 74 supplies the clock signal to the arbitrary waveform generating section 58, the random jitter generating section 60, and the AD converter 62. The arbitrary waveform generating section 58 generates the arbitrary waveform jitter in synchronization with the clock signal output from the clock selecting section 74. The random jitter generating section 60 generates the random jitter signal in synchronization with the clock signal output from the clock selecting section 74. The AD converter 62 samples the analog signal using the clock signal output from the clock selecting section 74.

Accordingly, the clock selecting section 74 can inject the timing signal with jitter corresponding to the arbitrary waveform jitter, the random jitter, and the analog jitter in synchronization with the system clock of the test apparatus 20. The clock selecting section 74 can instead inject the timing signal with jitter corresponding to the arbitrary waveform jitter, the random jitter, and the analog jitter that are not in synchronization with the system clock of the test apparatus 20.

By using the jitter control section 26 and the jitter injecting section 28 described above, the test apparatus 20 can inject the test signal with jitter corresponding to the test pattern. Furthermore, in addition to the jitter corresponding to the test pattern, the jitter control section 26 and the jitter injecting section 28 enable the test apparatus 20 to inject the test signal with jitter caused by other reasons that do not depend on the test pattern, such as sinusoidal jitter including arbitrary waveform jitter, random jitter, and jitter corresponding to an analog signal.

Figure 3:
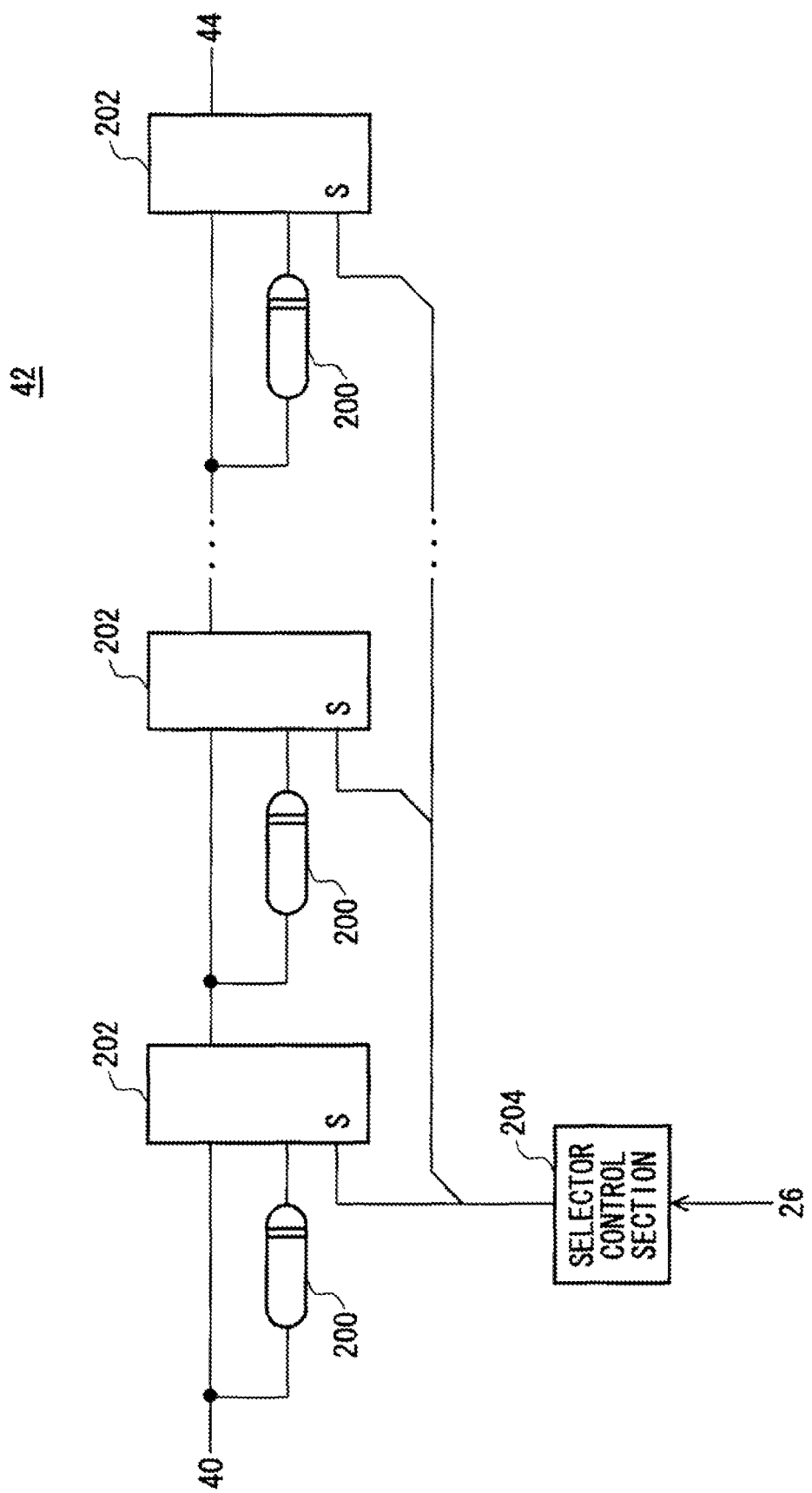
FIG. 3 shows an exemplary configuration of the variable delay section 42 according to the present embodiment.

FIG. 3 shows an exemplary configuration of the variable delay section 42 according to the present embodiment. The variable delay section 42 includes a plurality of delay elements 200 arranged in parallel, a plurality of selectors 202 provided to correspond to the plurality of delay elements 200, and a selector control section 204. Each delay element 200 delays the timing signal input thereto by a certain delay amount, and outputs the delayed signal.

The first-stage delay element 200 from among the plurality of delay elements 200 delays the timing signal input thereto by the signal input section 40. The other delay elements 200 each delay the timing signal output by the selector 202 corresponding to the delay element 200 at the immediately prior stage. The final-stage delay element 200 outputs the timing signal to the outside via the signal output section 44.

Each of the plurality of selectors 202 selects either the timing signal passed by the corresponding delay element 200 or the timing signal that is not passed by the corresponding delay element 200, i.e. the timing signal output from the selector 202 corresponding to the delay element 200 at the immediately prior stage. Each selector 202 outputs the selected timing signal.

The selector control section 204 controls whether each selector 202 selects the timing signal passed by the corresponding delay element 200 or the timing signal that is not passed by the corresponding delay element 200, according to the jitter control signal output from the jitter control section 26. More specifically, the selector control section 204 controls the selectors 202 such that the total delay amount from the signal input section 40 to the signal output section 44 equals a value corresponding to the jitter amount represented by the jitter control signal output from the jitter control section 26. By using the variable delay section 42 in this way, the test apparatus 20 can delay the timing signal by a delay amount corresponding to the jitter amount represented by the jitter control signal.

Instead of the plurality of delay elements 200, the plurality of selectors 202, and the selector control section 204, the variable delay section 42 may include an analog variable delay circuit and a DA convening section. The analog variable delay circuit delays the timing signal by a delay amount corresponding to the analog control signal.

For example, the analog variable delay circuit may delay the timing signal passing through a buffer circuit by changing the output capacity of the buffer circuit according to the analog control signal. Instead, the analog variable delay circuit may delay the timing signal passing through a buffer circuit by changing the drive current applied to the buffer circuit according to the analog control signal.

The DA converting section supplies the analog variable delay circuit with the analog control signal obtained by DA converting the jitter control signal. This variable delay section 42 can control the delay amount in finer increments and with higher speed.

The variable delay section 42 may include the analog variable delay circuit and the DA converting section in addition to the plurality of delay elements 200, the plurality of selectors 202, and the selector control section 204. In this case, the analog variable delay circuit is connected in series at a stage following the delay elements 200, for example. The DA converting section supplies the analog variable delay circuit with the analog control signal obtained by DA converting the digital signal output from the selector control section 204.

The selector control section 204 divides the digital jitter control signal output from the jitter control section 26 into (i) a digital signal expressing a coarse delay amount by which the plurality of delay elements 200 delay the timing signal and (ii) a digital signal expressing a fine delay amount by which the analog variable delay circuit delays the timing signal. The selector control section 204 then switches the plurality of selectors 202 according to the digital signal expressing the coarse delay amount. The selector control section 204 supplies the DA converting section with the digital signal expressing the fine delay amount.

Figure 4:
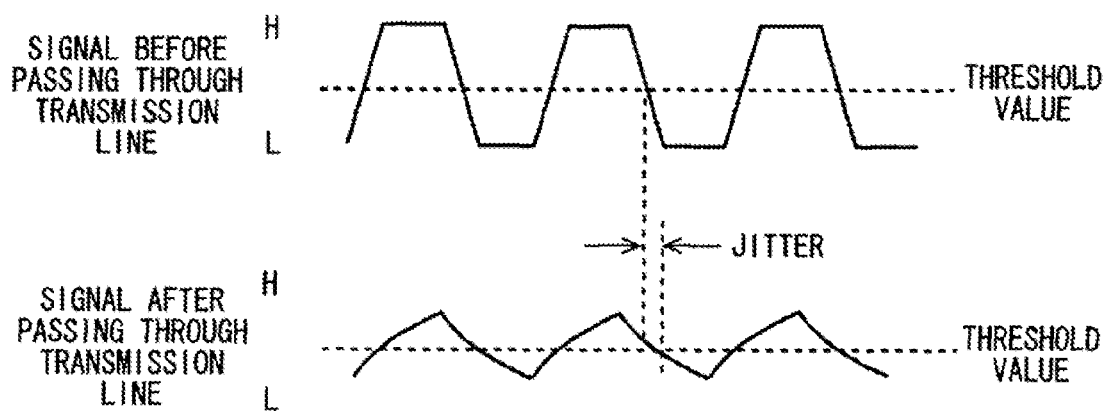
FIG. 4 shows a waveform of a logically-inverted high-frequency signal before passing through the transmission line and a waveform of the logically-inverted high-frequency signal after passing through the transmission line.
Figure 5:
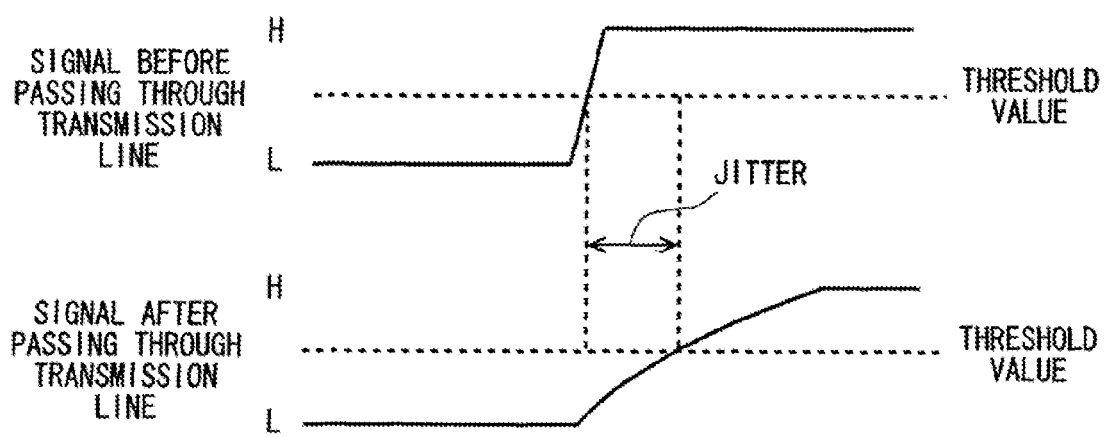
FIG. 5 shows a waveform of a logically-inverted low-frequency signal before passing through the transmission line and a waveform of the logically-inverted low-frequency signal after passing through the transmission line.

FIG. 4 shows a waveform of a logically-inverted high-frequency signal before passing through the transmission line and a waveform of the logically-inverted high-frequency signal after passing through the transmission line. FIG. 5 shows a waveform of a logically-inverted low-frequency signal before passing through the transmission line and a waveform of the logically-inverted low-frequency signal after passing through the transmission line.

The digital filter 56 generates the pattern-dependent jitter signal representing the jitter that is injected to the test signal and that depends on the waveform of the test signal, by digitally filtering the test pattern output from the pattern generating section 22. In this way, the digital filter 56 can generate a signal that represents jitter caused by inter-symbol interference, transmission line loss, and the like.

Here, the jitter caused by the transmission line loss is caused by decay of the settling characteristic of the signal passing through the transmission line. However, even when the settling characteristic of a high-frequency signal such as shown in FIG. 4 decays, there is only a small amount of jitter since a change begins before the settling period has passed, that is, before completely reaching the next logic level. On the other hand, a signal whose L level or H level logically inverts after a long time has passed, such as shown in FIG. 5, has a large amount of jitter since a delay corresponding to the decay of the settling characteristic is reflected in the jitter.

Accordingly, when a test pattern designating a low-frequency waveform is input, the digital filter 56 performs filtering to increase the amplitude of the output pattern-dependent jitter signal, and when a test pattern designating a high-frequency waveform is input, the digital filter 56 performs filtering to decrease the amplitude of the output pattern-dependent jitter signal. More specifically, the digital filter 56 increases the amplitude of the output pattern-dependent jitter signal when the input test pattern designates a waveform in which either logic H or logic L is continuous over a long period of time. Furthermore, the digital filter 56 decreases the amplitude of the output pattern-dependent jitter signal when the input test pattern designates a waveform that repeatedly alternates between logic H or logic L in a short period of time. In this way, the digital filter 56 can be used to generate the pattern-dependent jitter signal representing jitter caused by transmission line loss.

Figure 6:
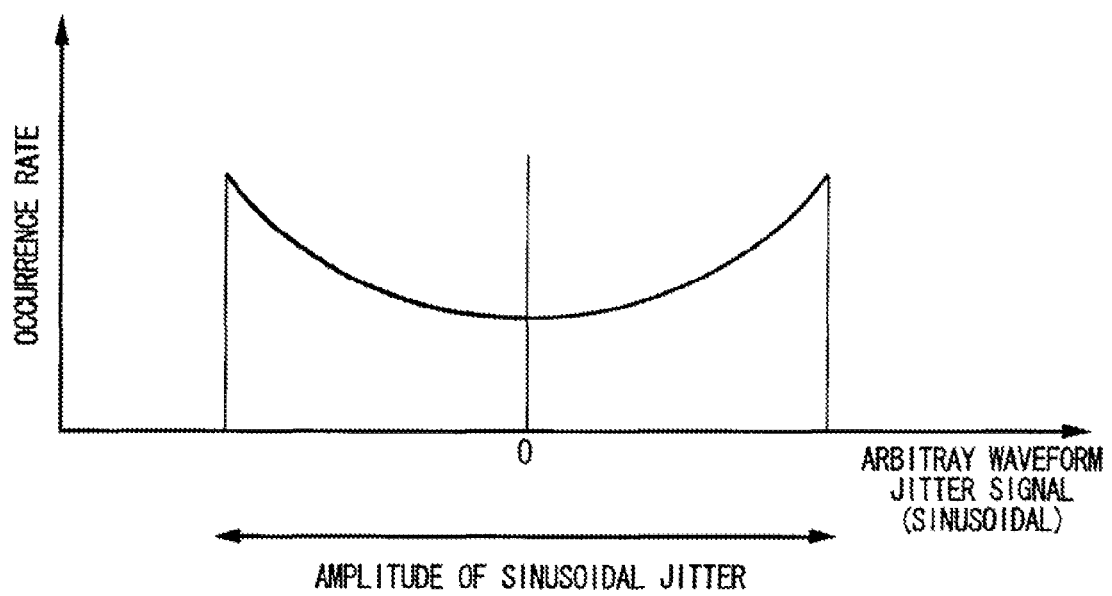
FIG. 6 shows an occurrence probability of an arbitrary waveform jitter signal representing sinusoidal jitter, generated by the arbitrary waveform generating section 58 of the present embodiment.

FIG. 6 shows an occurrence probability of an arbitrary waveform jitter signal representing sinusoidal jitter, generated by the arbitrary waveform generating section 58 of the present embodiment. The arbitrary waveform generating section 58 may generate the arbitrary waveform jitter signal representing arbitrary waveform jitter by sequentially and cyclically reading discrete data values representing the jitter waveform of one pre-stored period in synchronization with the clock signal. In this way, the arbitrary waveform generating section 58 can inject the test signal with sinusoidal jitter, square wave jitter, jitter represented by a ramp distribution, jitter represented by a binomial distribution, and the like. Prior to testing, the arbitrary waveform generating section 58 may receive the discrete data values representing the jitter waveform from an external memory and storage medium, for example.

In particular, the arbitrary waveform generating section 58 may sequentially and cyclically read discrete data values representing a sinusoidal signal of one pre-stored period in synchronization with the clock signal. In this way, the arbitrary waveform generating section 58 can output an arbitrary waveform jitter signal representing sinusoidal jitter, such as expressed by the probability distribution in FIG. 6.

Figure 7:
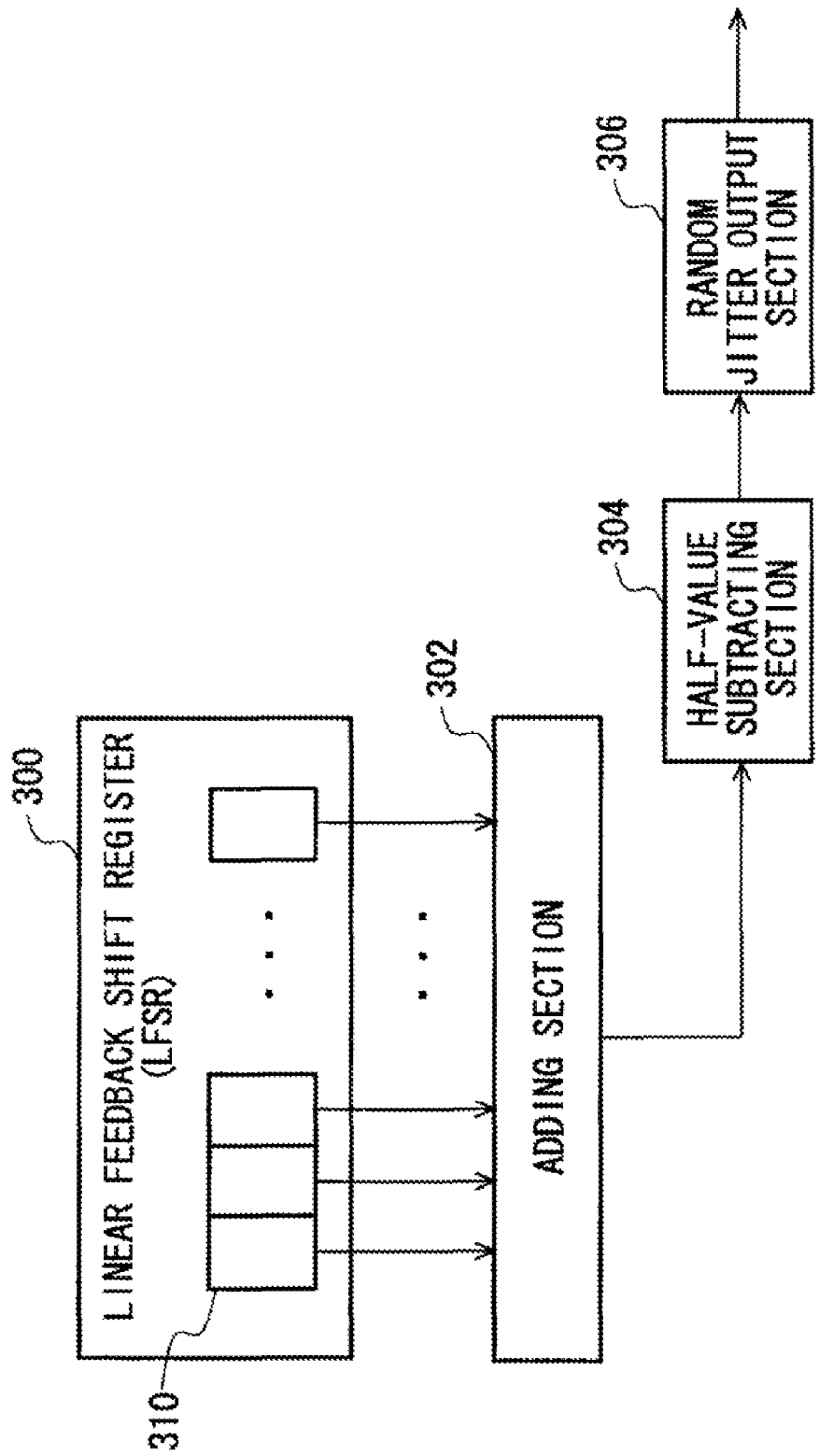
FIG. 7 shows an exemplary configuration of the random jitter generating section 60 according to the present embodiment.
Figure 8:
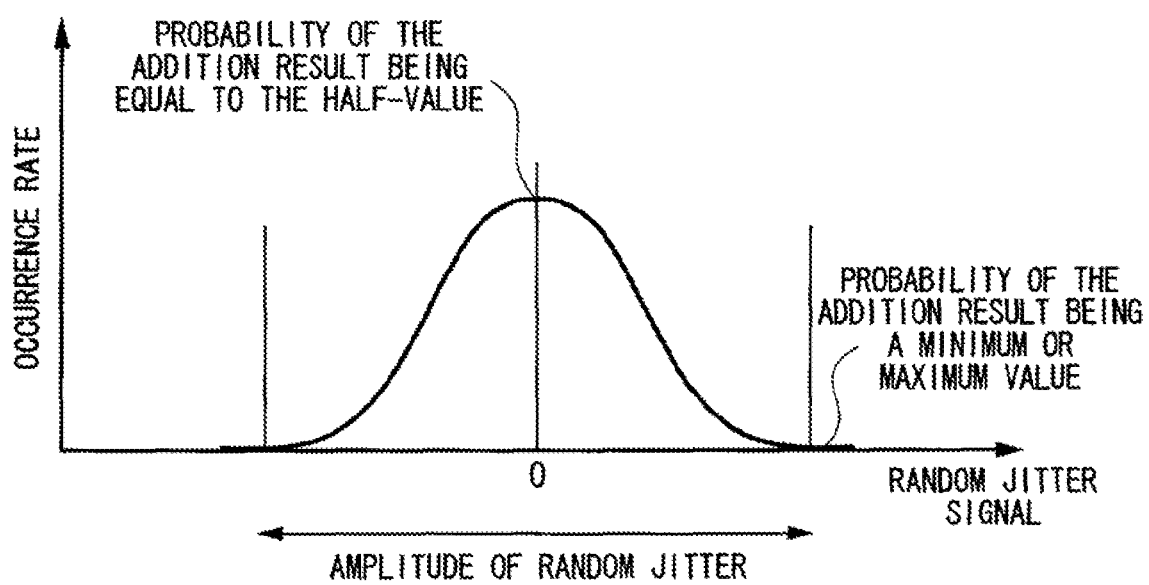
FIG. 8 shows occurrence probability of the random jitter signal generated by the random jitter generating section 60 according to the present embodiment.

FIG. 7 shows an exemplary configuration of the random jitter generating section 60 according to the present embodiment. FIG. 8 shows occurrence probability of the random jitter signal generated by the random jitter generating section 60 according to the present embodiment.

The random jitter generating section 60 may include a linear feedback shift register (LFSR) 300, an adding section 302, a half-value subtracting section 304, and a random jitter output section 306. The LFSR 300 includes a prescribed number of shill registers 310 in stages, and emits a pseudorandom signal from the final-stage shift register 310. More specifically, the LFSR 300 generates the pseudorandom signal using the following process.

First, the LFSR 300 calculates an exclusive OR of bit values stored in registers in the shift register 310 that are determined according to an irreducible polynomial for generating a pseudorandom sequence. Next, the LFSR 300 outputs the bit value stored in the final-stage register as the pseudorandom signal, and shifts each bit value in the shift register 310. The LFSR 300 then stores the result of the exclusive OR calculation in the first-stage register. The LFSR 300 repeats the above process for each period of the clock signal. In this way, the LFSR 300 can generate the pseudorandom signal using a simple configuration.

For each clock period, the adding section 302 outputs an added value obtained by adding together the bit values of a plurality of registers in the shift register 310 of the LFSR 300. The half-value subtracting section 304 outputs a half-value subtracted value obtained by subtracting, from the added value, the half-value of the number of registers storing the bit values added together by the adding section 302. For example, if there are n registers in the shift register 310, the half-value subtracting section 304 outputs a half-value subtracted value obtained by subtracting (n/2) from the added value calculated by the adding section 302. The random jitter output section 306 outputs a random jitter signal corresponding to the half-value subtracted value.

Here, in the pseudorandom signal generated by the LFSR 300, the occurrence rates of 0 and 1 are both extremely close to 50%. Furthermore, when there are n stages in the shift register 310, the probability of a 1 (or a 0) being stored in only one register in the shift register 310 is expressed by $1/(2^n-1)$. Accordingly, the random jitter signal obtained by subtracting the half-value from the added values obtained as a sum of all of the bit values stored in all of the registers has a waveform that approximates a Gaussian distribution with a peak at 0, as shown in FIG. 8.

Therefore, by using the random jitter generating section 60 shown in FIG. 7, the test apparatus 20 can generate a random jitter signal expressing random jitter using a simple configuration. Prior to testing, the LFSR 300 may receive a value indicating the type of pseudorandom signal from an external memory and storage medium, for example, and store this value in the shill register 310.

Figure 9:
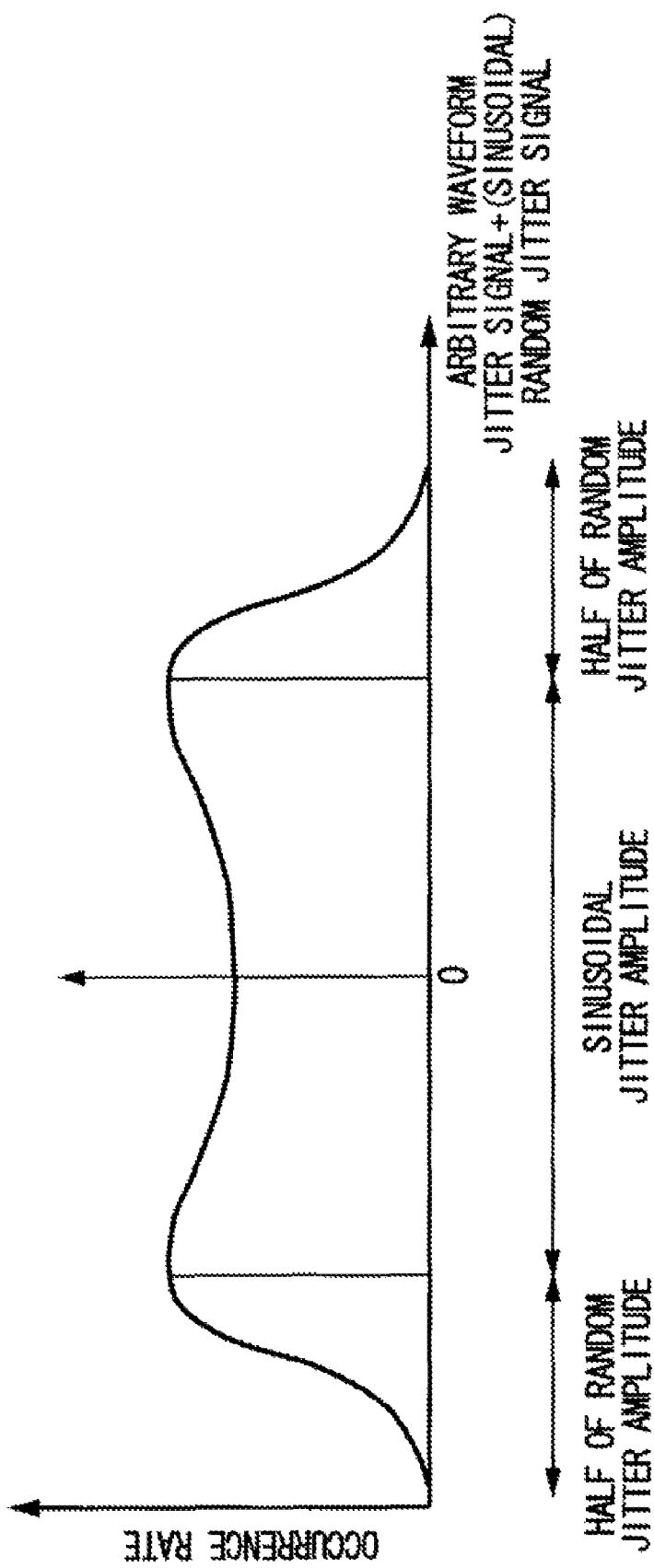
FIG. 9 shows occurrence probability of a jitter signal obtained by adding together the random jitter signal and the arbitrary waveform jitter signal representing sinusoidal jitter.

FIG. 9 shows occurrence probability of a jitter signal obtained by adding together the random jitter signal and the arbitrary waveform jitter signal representing sinusoidal jitter. For example, the adding section 64 may output, as the jitter control signal, a jitter signal obtained by adding together the arbitrary waveform jitter signal generated by the arbitrary waveform generating section 58 and the random jitter signal generated by the random jitter generating section 60.

The jitter injected into a signal transmitted between semiconductor devices, for example, includes jitter such as sinusoidal jitter that is caused by a deterministic source and random jitter that is caused by a non-deterministic source. The adding section 64 can calculate any combination of jitter corresponding to the test pattern, arbitrary waveform jitter of a sinusoidal waveform or the like, random jitter, and jitter corresponding to an analog signal. Accordingly, the test apparatus 20 can reproduce jitter caused by a variety of sources and inject this jitter into the test signal.

Figure 10:
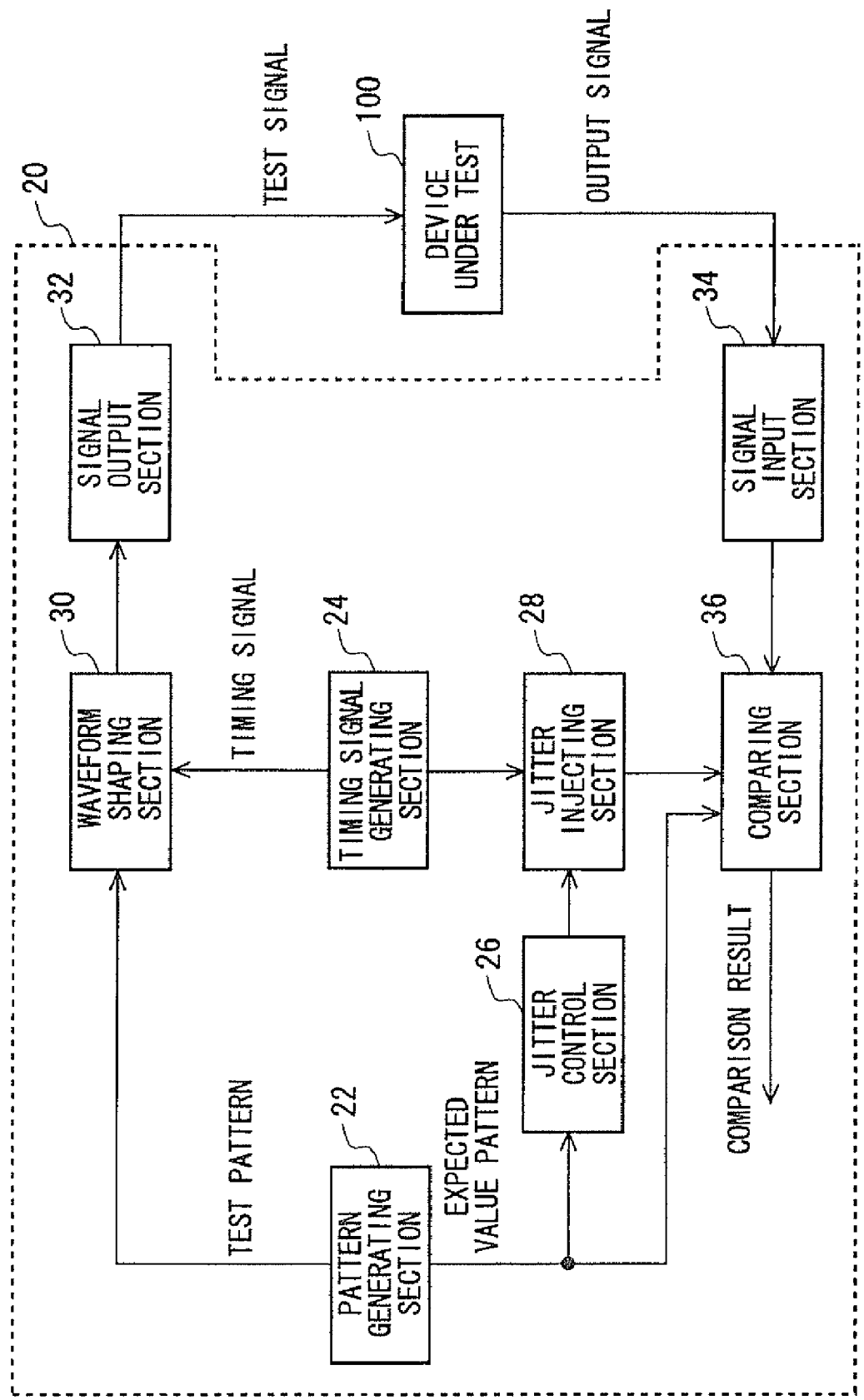
FIG. 10 shows a configuration of the test apparatus 20 according to a first modification of the present embodiment, along with the device under test 100.

FIG. 10 shows a configuration of the test apparatus 20 according to a first modification of the present embodiment, along with the device under test 100. The components of the test apparatus 20 of the present modification adopt the same function and configuration as the components having the same reference numerals in FIG. 1, and therefore the following description includes only differing points.

The jitter injecting section 28 injects jitter into a strobe signal, instead of into a timing signal. More specifically, the jitter injecting section 28 injects jitter into the strobe signal by delaying the strobe signal supplied from the timing signal generating section 24 to the comparing section 36 according to the jitter control signal.

The jitter control section 26 outputs a jitter control signal representing the jitter to be injected into the output signal, instead of representing the jitter to be injected into the test signal. The digital filter 56 of the jitter control section 26 filters the expected value pattern, instead of filtering the test pattern, to output the jitter control signal representing the jitter corresponding to the expected value pattern. The comparing section 36 compares the output signal to the expected value pattern at a timing of the strobe signal into which the jitter is injected.

The test apparatus 20 of the present modification injects jitter corresponding to the expected value pattern into the strobe signal indicating the timing of the comparison between the output signal and the expected value. In this way, the test apparatus 20 of the present modification can obtain comparison results between the output signal and the expected value signal when the output signal is injected with the jitter corresponding to the expected value pattern. The test apparatus 20 may be provided with both (i) the timing signal generating section 24 and the jitter control section 26 for injecting the jitter corresponding to the test pattern into the timing signal, as shown in FIG. 1, and (ii) the timing signal generating section 24 and the jitter control section 26 for injecting the jitter corresponding to the expected value pattern into the strobe signal, as shown in FIG. 10.

Figure 11:
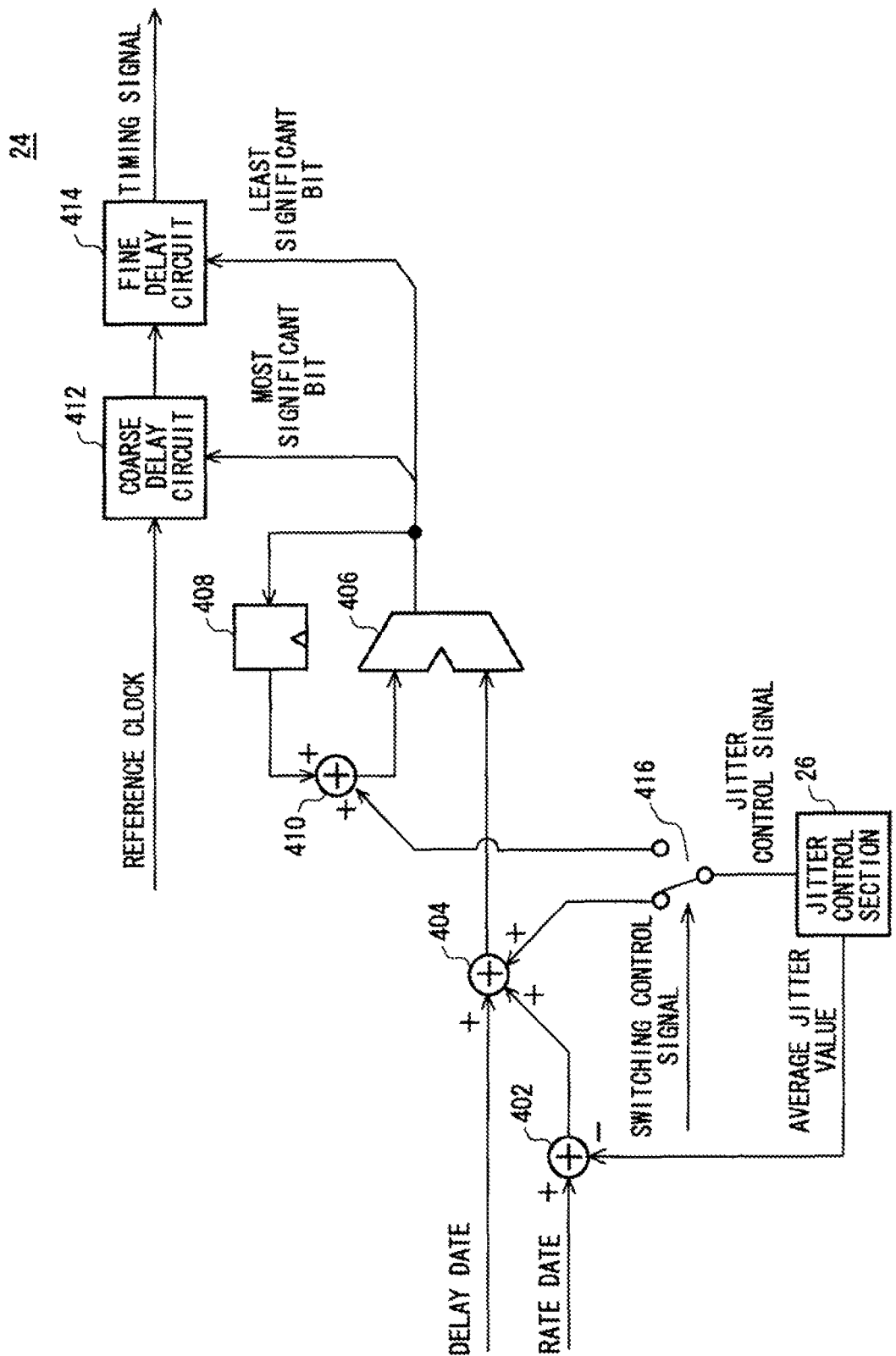
FIG. 11 shows a configuration of the timing signal generating section 24 according to a second modification of the present embodiment, along with the jitter control section 26.

FIG. 11 shows a configuration of the timing signal generating section 24 according to a second modification of the present embodiment, along with the jitter control section 26. The components of the test apparatus 20 of the present modification adopt the same function and configuration as the components having the same reference numerals in FIG. 1, and therefore the following description includes only differing points.

The test apparatus 20 of the present modification injects the timing signal with jitter corresponding to the jitter control signal inside the timing signal generating section 24, and is not provided with the jitter injecting section 28. In other words, the timing signal generating section 24 outputs a timing signal into which jitter corresponding to the jitter control signal is injected in advance.

The timing signal generating section 24 of the present modification may include a first adder 402, a second adder 404, a cumulative adding section 406, a latch 408, a third adder 410, a coarse delay circuit 412, and a fine delay circuit 414. The jitter control section 26 of the present embodiment outputs a jitter control signal and an average value of the jitter represented by the jitter control signal.

The first adder 402 subtracts the average jitter value from rate data expressing the test period. In this way, the jitter control section 26 can inject jitter in a positive direction and a negative direction to the generation timing of a waveform (edge) having no jitter.

The second adder 404 outputs a delay control value obtained by adding together delay data, the value obtained by subtracting the average jitter value from the rate data, and the jitter control signal. The delay data represents the delay amount from a reference timing in the test period to the timing at which the waveform (edge) is to be generated according to the test pattern.

The cumulative adding section 406 outputs a cumulative delay control value obtained by adding together the delay control value output by the second adder 404 and the value output by the third adder 410. The latch 408 delays the cumulative delay control signal output from the cumulative adding section 406 by an amount equal to one test period. The third adder 410 supplies the cumulative adding section 406 with a value obtained by adding together the cumulative delay control signal output from the latch 408 and the jitter control signal. In this way, the cumulative adding section 406 can output a cumulative delay control signal obtained by cumulatively adding together the delay control signal output from the second adder 404.

The coarse delay circuit 412 delays a reference clock serving as a reference for the test period by an amount corresponding to the value of the most significant hit of the cumulative delay control value. For example, the coarse delay circuit 412 may delay the reference clock by an amount equal to period units of the operational clock.

The fine delay circuit 414 delays the reference clock, which is already delayed by the coarse delay circuit 412, by an amount corresponding to the least significant bit of the cumulative delay control value. For example, the fine delay circuit 414 delays the reference clock by a small amount that is less than the operational clock of the timing signal generating section 24. The fine delay circuit 414 outputs the delayed reference clock to the outside as the timing signal.

The jitter injection switching section 416 switches whether the jitter control signal output from the jitter control section 26 is output to the second adder 404 or the cumulative adding section 406. The jitter injection switching section 416 may switch the output destination of the jitter control signal according to a switching control signal received from a controller of the test apparatus 20 and the pattern generating section 22, for example.

The timing signal generating section 24 with the configuration described above can output a timing signal into which is injected, in advance, jitter corresponding to the jitter control signal output from the jitter control section 26. Furthermore, since the second adder 404 injects delay data into the jitter control signal, the timing signal generating section 24 can inject the timing signal of a certain test period with jitter having no correlation with the jitter injected into the waveform of the prior and following test periods. In other words, the timing signal generating section 24 can inject the timing signal with instantaneous jitter. In this way, the jitter control section 26 can inject the test signal with jitter such as sinusoidal jitter caused by deterministic sources.

Furthermore, since the third adder 410 injects the jitter control signal with the cumulative delay control value, the timing signal generating section 24 can inject the timing signal with cumulatively added jitter. In this way, the jitter control section 26 can inject the timing signal with jitter simulating SSB noise occurring near the central frequency of the oscillation signal. Accordingly, the jitter control section 26 can inject the test signal with jitter having, as a main component, phase noise of a PLL circuit and an oscillation circuit, or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a pattern generating section that generates a test pattern;
    a timing signal generating section that generates a timing signal indicating a timing for supplying the test signal to the device under test;
    a digital filter that receives the test pattern from the pattern generating section and filters the test pattern to output a jitter control signal representing jitter corresponding to the test pattern, the digital filter increasing the amplitude of the output jitter control signal when the test pattern designates a low-frequency waveform and decreasing the amplitude of the output jitter control signal when the test pattern designates a high-frequency waveform;
    a jitter injecting section that receives the timing signal from the timing signal generating section and injects the timing signal with jitter
    by delaying the timing signal according to the jitter control signal; and
    a waveform shaping section that receives the test pattern from the pattern generating section and receives the timing signal injected with jitter by the jitter injecting section, and generates the test signal formed according to the test pattern, with the timing signal into which the jitter is injected as a reference.

2. The test apparatus according to claim 1, further comprising an injection control section that receives an injection control signal designating whether jitter is to be injected into the timing signal, and, when the injection control signal designates that jitter is not to be injected, sets the jitter control signal to have a value that does not result in jitter injection.

3. The test apparatus according to claim 1, further comprising an adding section that adds, to the jitter control signal, a jitter signal expressing a type of jitter different from the jitter corresponding to the test pattern.

4. The test apparatus according to claim 1, further comprising:
    a random jitter generating section that outputs a random jitter signal representing random jitter; and
    an adding section that adds the random jitter signal to the jitter control signal, wherein
    the random jitter generating section includes:

a linear feedback shift register that has a shift register with a prescribed number of stages, and that generates a pseudorandom signal from a final-stage register in the shift register;

an adding section that outputs an added value obtained by adding together bit values of a plurality of registers in the shift register;

a half-value subtracting section that outputs a value obtained by subtracting from the added value a number equal to half the number of registers storing the bit values outputs a half value; and a random jitter output section that outputs the random jitter signal corresponding to the half-value subtracted value.

5. A test apparatus that tests a device under test, comprising:

a signal output section that outputs a test signal to the device under test;

a signal input section that receives an output signal from the device under test output in response to the test signal;

a pattern generating section that generates an expected value pattern;

a timing signal generating section that generates a strobe signal indicating a timing for comparing the expected value pattern and the output signal;

a digital filter that receives the expected value pattern from the pattern generating section and filters the expected value pattern to output a jitter control signal representing jitter corresponding to the expected value pattern, the digital filter increasing the amplitude of the output jitter control signal when the expected value pattern designates a low-frequency waveform and decreasing the amplitude of the output jitter control signal when the expected value pattern designates a high-frequency waveform;

a jitter injecting section that receives the strobe signal from the timing signal generating section and that injects the strobe signal with jitter by delaying the strobe signal according to the jitter control signal; and a comparing section that compares the output signal to the expected value pattern at a timing of the strobe signal into which the jitter is injected.

6. A method for testing a device under test, comprising:

generating a test pattern;

generating a timing signal indicating a timing for supplying the test signal to the device under test;

filtering the test pattern to output a jitter control signal representing jitter corresponding to the test pattern such that the amplitude of the output jitter control signal is increased when the test pattern designates a low-frequency waveform and the amplitude of the output jitter control signal is decreased when the test pattern designates a high-frequency waveform;

injecting the timing signal with jitter by delaying the timing signal according to the jitter control signal; and generating the test signal formed according to the test pattern, with the timing signal into which the jitter is injected as a reference.

7. A method for testing a device under test, comprising:

outputting a test signal to the device under test;

receiving an output signal from the device under test output in response to the test signal;

generating an expected value pattern;

generating a strobe signal indicating a timing for comparing the expected value pattern and the output signal;

filtering the expected value pattern to output a jitter control signal representing jitter corresponding to the expected value pattern such that the amplitude of the output jitter control signal is increased when the expected value pattern designates a low-frequency waveform and the amplitude of the output jitter control signal is decreased when the expected value pattern designates a high-frequency waveform;

injecting the strobe signal with jitter by delaying the strobe signal according to the jitter control signal; and comparing the output signal to the expected value pattern at a timing of the strobe signal into which the jitter is injected.

* * * * *